(12) United States Patent
Barber

(10) Patent No.: US 6,273,963 B1
(45) Date of Patent: Aug. 14, 2001

(54) STRUCTURE AND METHOD FOR COMPACTION OF POWDER-LIKE MATERIALS

(75) Inventor: John P. Barber, Kettering, OH (US)

(73) Assignee: IAP Research, Inc., Dayton, OH (US)

( * ) Notice: Subject to any disclaimer, the term of this patent is extended or adjusted under 35 U.S.C. 154(b) by 661 days.

(21) Appl. No.: 08/681,898

(22) Filed: Jul. 29, 1996

Related U.S. Application Data

(60) Continuation-in-part of application No. 08/368,301, filed on Jan. 3, 1995, now Pat. No. 5,611,230, which is a division of application No. 07/834,148, filed on Feb. 10, 1992, now Pat. No. 5,405,574.

(51) Int. Cl.$^7$ .............................. C21D 1/04; B29B 13/08
(52) U.S. Cl. ..................................... 148/108; 425/174.8
(58) Field of Search ..................... 148/108; 425/174.8 R

(56) References Cited

U.S. PATENT DOCUMENTS

| | | | |
|---|---|---|---|
| 2,976,907 | 3/1961 | Harvey et al. | 153/10 |
| 3,346,914 | 10/1967 | Sandstrom et al. | 18/5 |
| 3,347,074 | 10/1967 | Eilers et al. | 72/56 |

(List continued on next page.)

OTHER PUBLICATIONS

United States Statutory Invention Registration No. H120, issued to Corwin, published Sep. 2, 1986 for Method of Electroforming a Ceramic Faced Workpiece.
International Search Report dated Apr. 7, 1998.
"Explosive compaction of metal powders", C.R.A. Lennon, A.K. Bhalla and J.D. Williams, Powder Metallurgy, 1978 No. 1.

"Crystallographically Oriented Superconducting $bi_2Sr_2CaCu_2O_8$ by Shock Compaction of Prealigned Powder," *Applied Physics Letters* 57, p. 93, Jul. 2, 1990.

(List continued on next page.)

Primary Examiner—Peter A. Nelson
(74) Attorney, Agent, or Firm—Jacox, Meckstroth & Jenkins

(57) ABSTRACT

Structure and a method for producing very dense bodies of material from particulate materials. A particulate material is placed within an electrically conductive container. A solenoid or coil encompasses the electrically conductive container, and a large magnitude of electrical current is caused to flow through the solenoid or coil. As the electrical current flows through the solenoid or coil, large magnitudes of magnetic pressures are created upon the electrically conductive container, and the electrically conductive container is compressed, and the transverse dimension thereof is reduced. Thus, the particulate material within the electrically conductive container is very firmly compacted, and a rigid body of material is provided. Any one of numerous types of particulate material may be employed. For example, a body of electrical superconductive material of any desire size and shape can be produced by this method by the use of superconducting particulate material. A method and system for selecting various parameters which enable the material to be "over-pressured" and densified to densities in excess of 90% of the material's maximum density is also illustrated in another embodiment of the invention. The various parameters include establishing a stand-off distance, a container wall density and thickness, a fill density and a compressibility value for the material. Once the various parameters are established and for a selected material, the material is magnetically compacted to over-pressure the material to a pressure level which exceeds the pressure applied by a wall of the container. This, in turn, enables the system and method to densify the material to densities in excess of 90% of its maximum density.

12 Claims, 5 Drawing Sheets

U.S. PATENT DOCUMENTS

| | | | |
|---|---|---|---|
| 3,838,488 | 10/1974 | Tada et al. | 29/200 |
| 4,130,926 | 12/1978 | Willem | 29/421 |
| 4,170,887 | 10/1979 | Baranov | 72/56 |
| 4,261,092 | 4/1981 | Corwin | 29/421 |
| 4,297,388 | 10/1981 | Kumar et al. | 427/47 |
| 4,380,473 | 4/1983 | Lichtinghagen | 419/41 |
| 4,592,889 * | 6/1986 | Leupold et al. | 419/66 |
| 4,717,627 | 1/1988 | Nellis et al. | 428/552 |
| 4,762,754 | 8/1988 | Nellis et al. | 428/552 |
| 4,929,415 | 5/1990 | Okazaki | 419/52 |
| 4,939,121 | 7/1990 | Rybka | 505/1 |
| 4,962,656 | 10/1990 | Kunerth et al. | 72/56 |
| 5,004,722 | 4/1991 | Tallman | 505/1 |
| 5,030,614 | 7/1991 | Hollander et al. | 505/1 |
| 5,057,486 | 10/1991 | Arendt et al. | 505/1 |
| 5,079,225 | 1/1992 | Holloway | 505/1 |
| 5,084,088 | 1/1992 | Okazaki | 75/10.1 |
| 5,096,880 | 3/1992 | Rybka | 505/1 |
| 5,101,560 | 4/1992 | Leonard et al. | 29/890.032 |
| 5,162,296 | 11/1992 | Yamazaki | 505/1 |
| 5,169,572 | 12/1992 | Matthews | 264/27 |
| 5,214,840 * | 6/1993 | Imagawa et al. | 29/603 |
| 5,250,255 | 10/1993 | Sagawa et al. | 419/39 |
| 5,262,396 | 11/1993 | Yamazaki | 505/1 |
| 5,405,574 | 4/1995 | Chelluri et al. | 419/47 |
| 5,503,686 * | 4/1996 | Okamura et al. | 148/108 |
| 5,611,139 * | 3/1997 | Chelluri et al. | 29/744 |
| 5,689,797 * | 11/1997 | Chelluri et al. | 419/38 |

OTHER PUBLICATIONS

"Metal Matrix High–Temperature Superconductor," *Metal Progress*, Advanced Materials and Processes, Inc., p. 37, Oct., 1987.

"Dynamic Magnetic Compaction (DMC) Of W–Steel Composite Powders," *Specialty Materials and Composites Advances in Particulate Materials*. Metal Powder Industries Federation: Princeton, N.J., vol. 5, pp. 219–226, 1994.

"Composite Solid Armature Consolidation By Pulse Power Processing: A Novel Homopolar Generator Application in EML Technology,".

"Melt–Textured Growth of Polycrystaline," Physical Review B, vol. 37, No. 13, May 1, 1988.

"High–Field Critical Current Densities," *1989 Applied Physics Letters*, p. 2441.

"Hot Extrusion of High–Temperature Superconducting Oxides," American Ceramics Bulletin, p. 813, May, 1991.

* cited by examiner

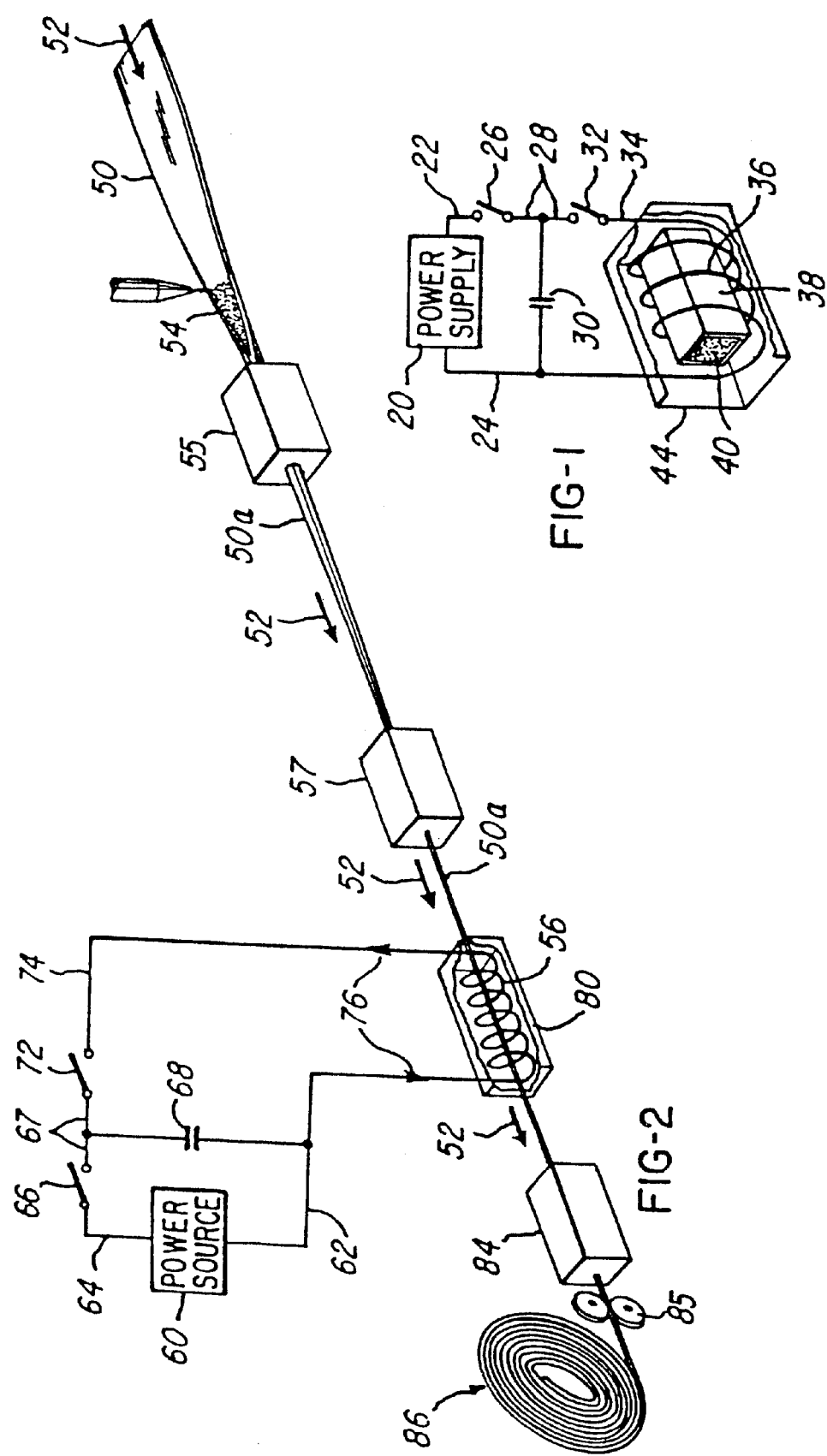

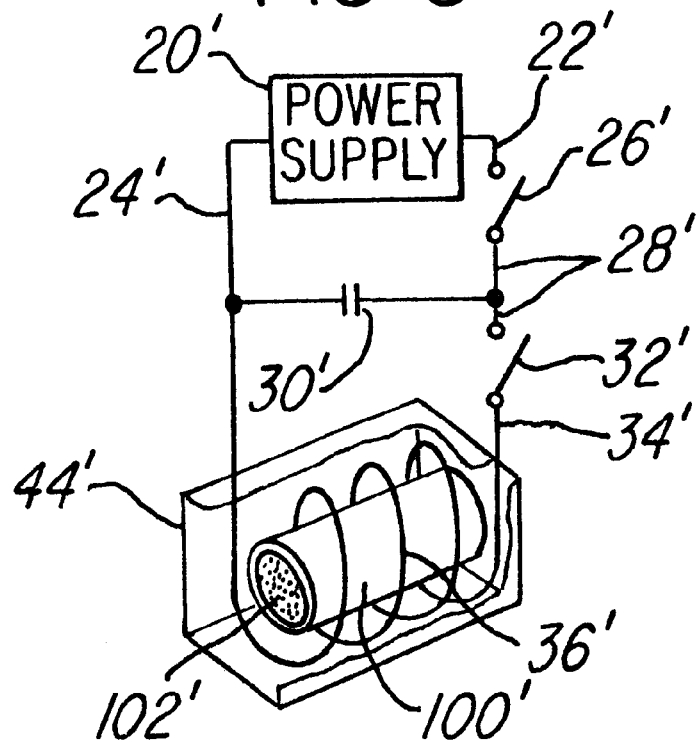
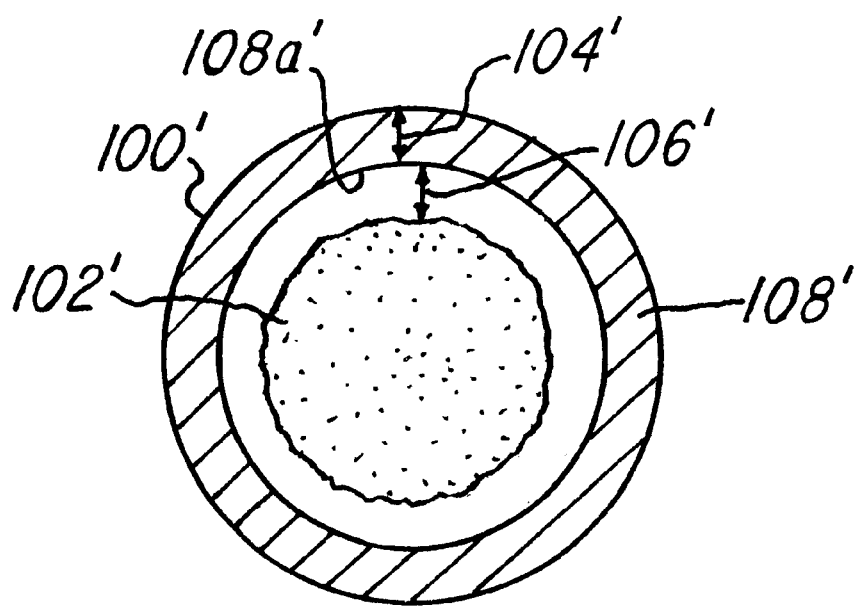

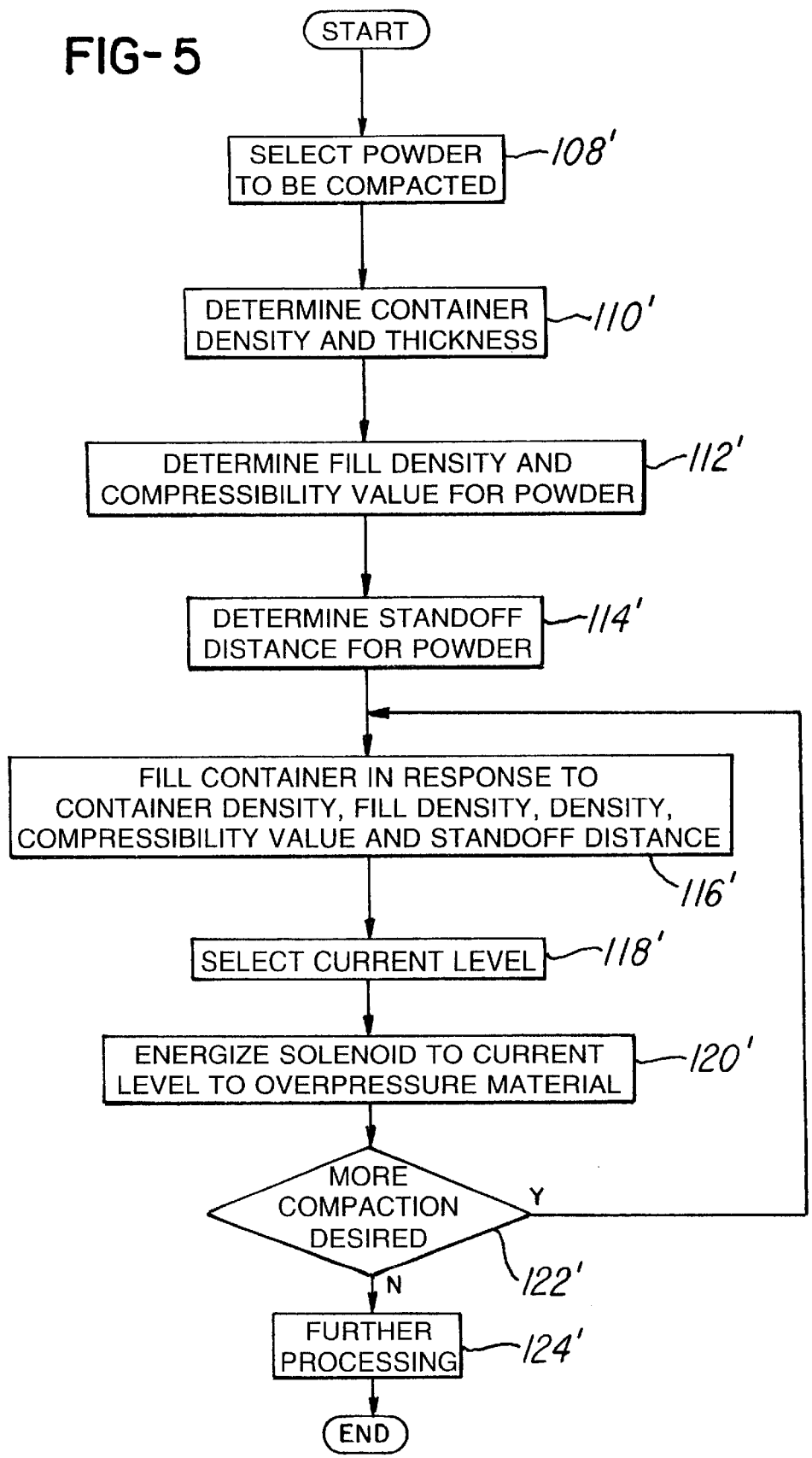

STRUCTURE AND METHOD FOR COMPACTION OF POWDER-LIKE MATERIALS

RELATED APPLICATION

This application is a continuation-in-part of application Ser. No. 08/368,301 filed Jan. 3, 1995, now U.S. Pat. No. 5,611,230, which is a division of Ser. No. 07/834,148 filed Feb. 10, 1992, now issued as U.S. Pat. No. 5,405,574.

BACKGROUND OF THE INVENTION

Several methods have been employed for forming particulate or powder-like materials into a unitary firmly compacted body of material.

Powdered metal bodies have been formed by means of pressure and heat. Such a method has also been used for forming unitary bodies from other powder or particulate materials.

A problem has specifically existed with regard to forming superconducting powders into a unitary firmly compacted body. Ceramic superconducting powders are normally prepared by proportioning the specific quantities of selected oxides. The combination is then thoroughly mixed by conventional means and then fired at elevated temperatures in suitable gaseous atmospheres. The induced solid state reaction causes the formation of the desired ceramic compositions and lattice structures.

In ceramic superconductors, the superconductivity within individual crystallites is proximity coupled to neighboring grains. Consequently, the orientation and coupling between crystallites are key factors affecting the current carrying capacity of the bulk ceramic superconductors. Voids, cracks, and grain boundaries act as weak links between crystallites and reduce the critical currents within the bulk material. Therefore, a technique which produces dense ceramics with good intergrain coupling and by which the material is formable into desired shapes to yield a required superconducting characteristic is of significant value.

At the present time several methods are used for obtaining high critical current densities in bulk superconducting materials.

One method employed is that of melt textured growth of polycrystalling material. This method is discussed in a paper included in Volume 37, No. 13, May 1, 1988, Physical Review B., S. Gin, et al., entitled: *Melt-Textured Growth of Polycrystaline*. This method consists of heating a bulk specimen of the high temperature material in a furnace to temperatures at which partial melting occurs. A temperature gradient is maintained in the furnace, and the superconductor is melted and recrystallized as the specimen is passed through the hot zone. Highly textured material is produced through this method and at present is shown to yield high Jc values. This method is generally limited to the processing of small length samples.

Another method is that of placing powder in a tube. This "powder in tube" method is discussed in a paper 1989 Applied Physics Letters, page 2441, prepared by K. Heine, et al., entitled: *High-Field Critical Current Densities*. In the "powder in tube" method, mechanical deformation is used to align plate-like particles of bismuth based superconductors. The powder is loaded into a tube of silver material and the assembly is compacted by swaging, drawing or rolling. A silver sheath provides a path to shunt currents across any defects. The material is subsequently heat treated to obtain the optimum superconductor characteristics.

However, as a result of the nature of varied mechanical operation involved in the two methods discussed above, reproducing the many processing steps repeatedly during fabrication of long lengths of wires and tapes remains unsatisfactory.

Another method of compaction is that of hot extrusion. This method is discussed in an article entitled: *Hot Extrusion of High-temperature Superconducting Oxides* by Uthamalingam Balachandran, et al., American Ceramic Bulletin, May 1991, page 813.

Another method is discussed in U.S. Pat. No. 5,004,722, Method of Making Superconductor Wires By Hot Isostatic Pressing After Bending.

Another compaction techniques which has been employed pertains to a shock method. This method is discussed in an article entitled: *Crystallographical oriented superconducting $Bi_2Sr_2CaCu_2O_8$ by shock compaction of prealigned powder* by C. L. Seaman, et al., in Applied Physics Letters 57, dated Jul. 2, 1990, page 93.

Another method of compaction is that known as an explosive method, discussed in an article entitled: *Metal Matrix High-Temperature Superconductor*, by L. E. Murr, et al., in Advanced Materials and Processes Inc. Metal Progress, October 1987, page 37.

These methods are limited in value because they are generally applicable only to production of small body sizes.

The application of large uniaxial static pressures at elevated temperatures is discussed in an article entitled: *Densification of $YBa_2Cu_2O_{7-8}$ by uniaxial pressure sintering*, by S. L. Town, et al., in Cryogenics, May 1990, Volume 30.

The use of electromagnetic forming for the purpose of attachment is discussed in a paper entitled: *Electromagnetic Forming*, by J. Bennett and M. Plum, published in Pulsed Power Lecture Series, Lecture No. 36.

However, processing of long lengths of homogenous and high quality superconducting tapes or wires by the processes discussed above has not been realized.

It is an object of this invention to provide a method and means for producing high density bodies by the use of powder-like and/or particulate materials.

It is another object of this invention to provide a method and means for producing electrical conductors by the use of powder-like or particulate materials.

It is another object of this invention to provide a method and means for producing high quality and continuous superconducting electrical conductors such as wires and tapes.

It is another object of this invention to provide such a method which can be consistently precisely duplicated in the quality of production.

Another object of the invention is to provide a method for magnetically compacting a powder to achieve in excess of 90% of its maximum density using applied pressures which have heretofore not been able to achieve such densities.

Another object of the invention is to provide a method and system for selecting various variables which enable the system and method to compact a material to a density which exceeds densities normally achieved with a given applied input pressure.

Still another object of the invention is to provide a method and system for accelerating a wall of a container for compacting a material to densities in excess of 90% of that material's maximum density.

Other objects and advantages of this invention reside in the construction of parts, the combinations thereof, and the methods employed, as will become more apparent from the following description.

SUMMARY OF THE INVENTION

In this invention, powder-like and/or particulate materials or the like are compacted into high density bodies. The high density bodies can be of various shapes and sizes, and may, for example, be bodies such as rods, tapes, tubes, or plates or any other suitably shaped or desirably shaped bodies.

The method and structure of this invention applies pressures generated by non-contact electromagnetic forces. These electromagnetic pressures are generated by employing suitably shaped coils, such as solenoids or the like which have the necessary current carrying capacity. In this process a suitable electrically conductive container is encompassed by such a coil or solenoid. Within the electrically conductive container powder-like material is enclosed. When high magnitudes of electrical current are passed through the solenoid or coil, very high pressures are applied to the electrically conductive container, and the electrically conductive container is reduced in transverse dimensions. Thus, the powder-like material within the electrically conductive container is compacted into a body of high density.

In one embodiment of this invention superconducting powders are placed upon an electrically conductive strip, and the strip is formed into a tubular member, thus enclosing the superconducting powders. The tubular member is encompassed by a solenoid or coil. High current levels are passed through the solenoid or coil, and a high magnitude of resulting electromagnetic pressure is applied to the tubular member. The transverse dimensions of the tubular member are significantly reduced and the superconductive powder within the tubular member is thus firmly compacted. If desired, this process can be performed in a continuous manner, so that an elongate conductor of superconductive material is produced. The compaction method of this invention is capable of producing wire or tape of normal electrical conducting material or of superconducting electrical materials.

BRIEF DESCRIPTION OF THE ACCOMPANYING DRAWINGS

FIG. 1 is a perspective diagrammatic view illustrating a structure and a method of compaction of powder-like materials in accordance with this invention;

FIG. 2 is a perspective diagrammatic type of view illustrating a method and structure in accordance with this invention for producing in a continuous process an elongate member, which may be referred to as a wire, or tape, or the like. The process illustrated can be employed for production of an elongate member of superconductive material;

FIG. 3 is a perspective diagrammatic view illustrating a structure and a method of compaction of powder-like materials in accordance with another embodiment of the invention;

FIG. 4 is a cross-sectional view of an armature showing a powder-like material situated therein and also showing a stand-off distance between a wall of a container and the material;

FIG. 5 is a schematic diagram of a method and process for compacting a material according to the invention;

Figure 6A:
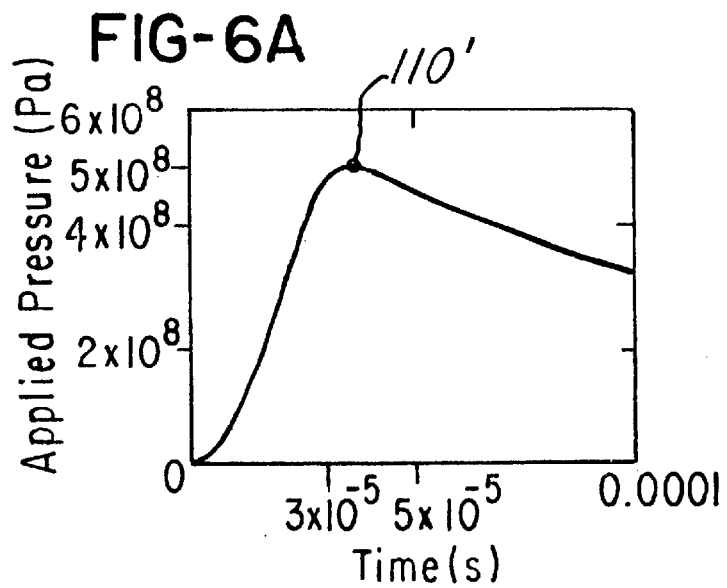
Figure 6B:
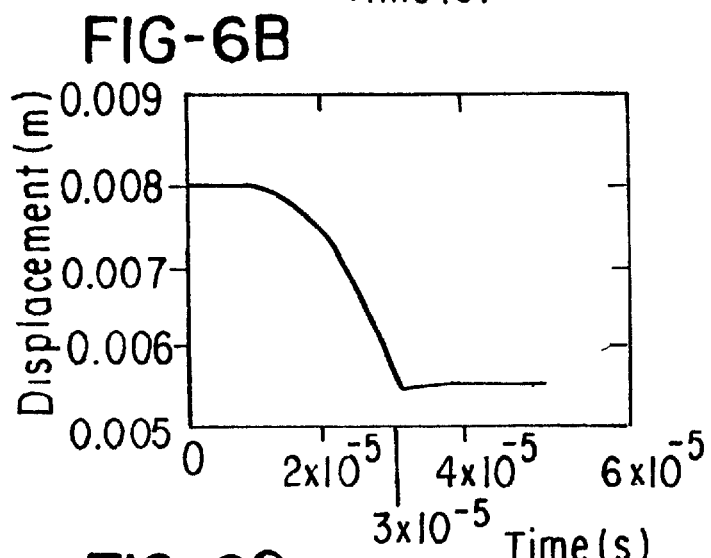
Figure 6C:
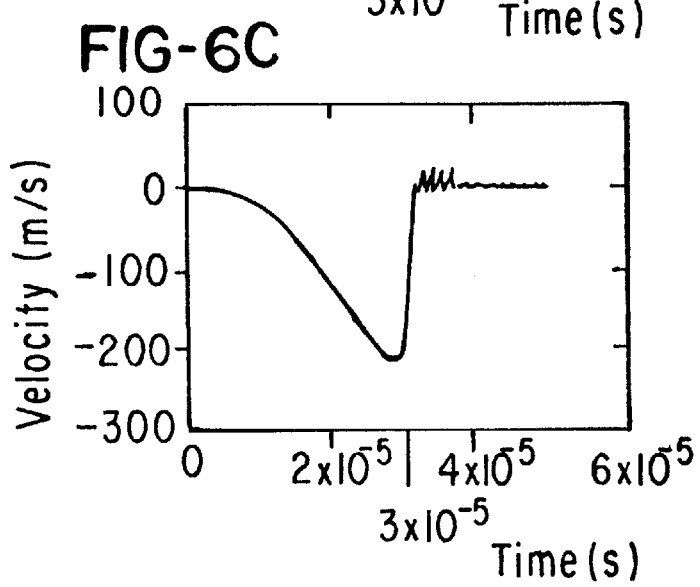
Figure 7A:
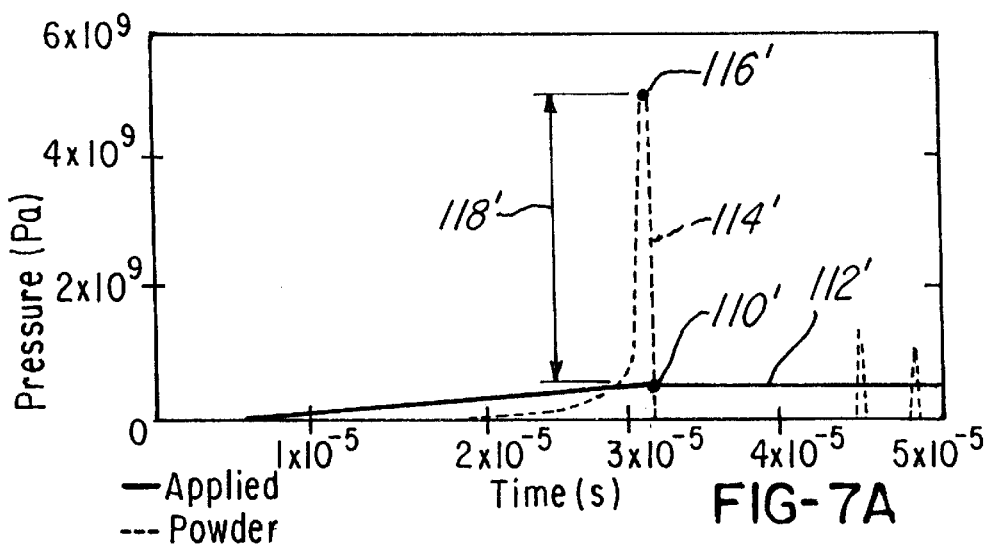
Figure 7B:
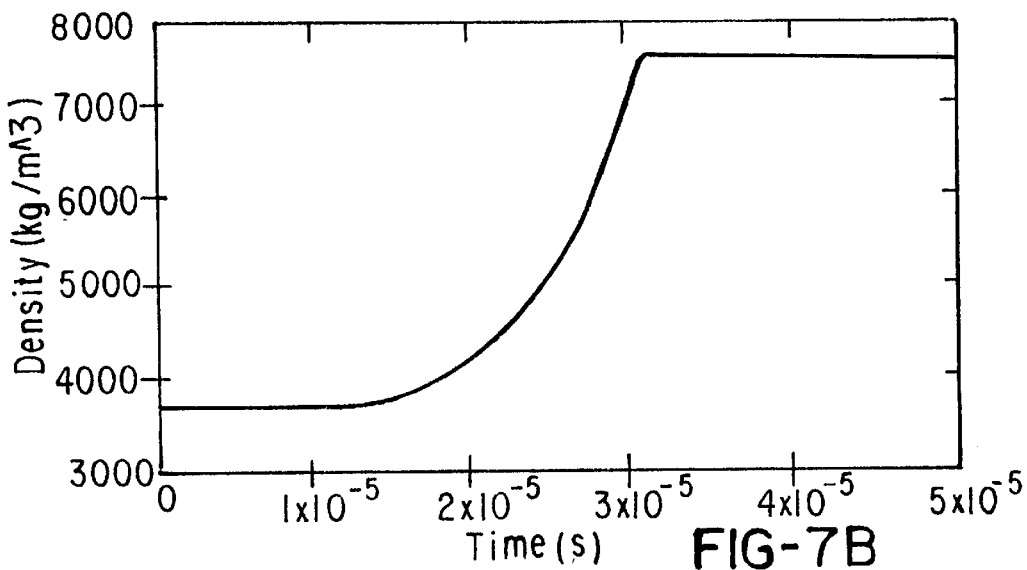
Figure 7C:
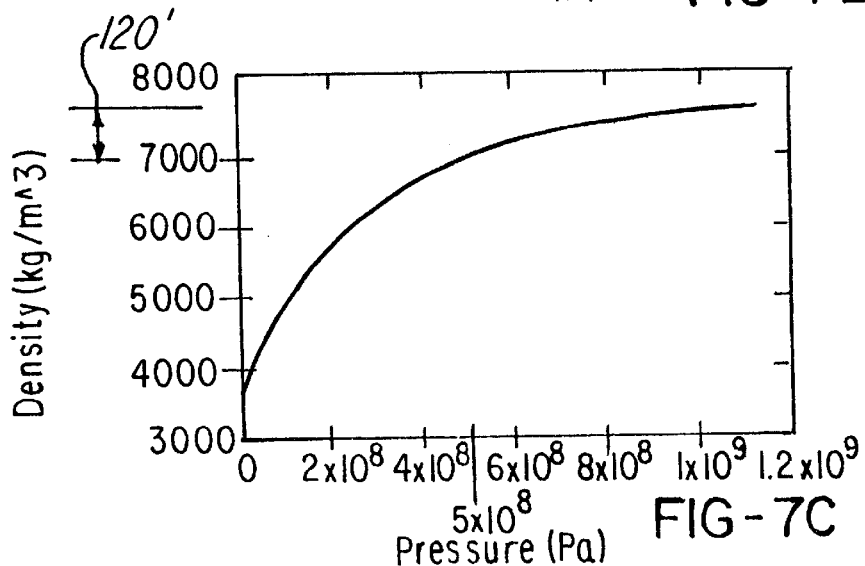

FIGS. 6A–6C are various graphic views illustrating various correlations between time, container wall displacement, container wall velocity and pressure applied by container wall to a material situated within the container; and FIG. 7A–7C illustrate further correlations associated with the invention and particularly an "overpressure" realized by a material compacted in accordance with this invention.

DETAILED DESCRIPTION OF THE PREFERRED EMBODIMENT

FIG. 1 shows direct current power supply 20 to which is connected electric conductors 22 and 24. Connected to the conductor 22 is a switch 26 which is also connected to a conductor 28. The conductor 28, and the conductor 24 have joined therebetween a capacitor 30. The conductor 28 is also connected to a switch 32 which is also connected to a conductor 34. The conductor 24 and the conductor 34 are connected to a solenoid or coil 36 which encompasses an electrically conductive container 38. The electrically conductive container 38 is shown as being rectangular in transverse dimensions. However, the electrically conductive container 38 may be of any suitable or desired shape and size. The electrically conductive container 38 may be of any suitable electrically conductive material, such as, for example, of silver material.

Within the electrically conductive container 38 is a quantity of powder material 40. The powder material 40 completely fills the electrically conductive container 38 and is firmly positioned therewithin.

In carrying out the process of this invention, the switch 26 is closed, and the capacitor 30 is charged from the power supply 20. After the capacitor 30 is completely charged, the switch 26 is opened and the switch 32 is closed. When the switch 32 is closed a large quantity of electrical current flows from the capacitor 30 through the solenoid or coil 36. When electrical current flows through the coil or solenoid 36 magnetic pressure is applied upon the electrically conductive container 38. This pressure acts inwardly upon the electrically conductive container 38, and the transverse dimensions of the electrically conductive container 38 are reduced. Thus, compression occurs within the electrically conductive container 38, and the powder-like material 40 within the electrically conductive container 38 is compressed and compacted. Thus, the powderous material 40 within the electrically conductive container 38 becomes a dense body.

As an example or illustration, the electrically conductive container 38 may have a transverse dimension of less than one inch or several inches, and current flow through the solenoid 36 may be in the order of about 100,00 amperes at a voltage of about 4,000 volts. It is to be understood, of course, that other magnitudes of current may be employed as found to be suitable in accordance with the size and physical characteristics of the electrically conductive container 38 and the physical characteristics and volume of the powder-like material 40. It is also to be understood that when the powder-like material 40 has good electrically conductive properties, the container thereof may not need to be electrically conductive for compaction of the powder-like material in accordance with the method of this invention.

Due to the fact that the solenoid or coil 36 tends to expand radially as current flows therethrough, suitable means are employed to restrain the coil 36 against lateral expansion as current flows therethrough. For example, as shown, a rigid wall 44 closely encompasses the coil 36 and restrains the coil 36 against expansion as current flows therethrough.

FIG. 2 illustrates structure and a method of the construction of an elongate body, such as a wire or tape or rod in accordance with this invention. A strip of electrically conductive material 50 in a flat condition is moved longitudinally as illustrated by arrows 52. A powderous material 54 having desired physical or electrical properties is poured upon the strip 50. When a superconductive body is desired, the powderous material 54 is superconductive material. Thus, the strip 50 carries the powder-like material 54.

Then be any suitable means, such as by means of a forming unit 55, the strip 50 is formed into a tubular member 50a, as the tubular member 50a encloses and carries the powder-like material 54. Then the diameter of the tubular member 50a is reduced as the tubular member 50a is drawn through a drawing unit 57. Thus, the diameter of the tubular member 50a is reduced as elongation of the tubular member 50a occurs. Thus, a degrees of compaction of the powder-like material occurs as drawing and elongation of the tubular member 50a occurs.

Then the tubular member 50a is moved into the confines of a solenoid or a coil 56. The coil 56 is energized form a power source 60. Electrical conductors 62 and 64 are connected to the power source 60. Joined to the conductor 64 is a switch 66. A conductor 67 is also connected to the switch 66. Connected to the conductors 62 and 67 is a capacitor 68. Also connected to the conductor 67 is a switch 72. Also connected to the switch 72 is a conductor 74. The conductor 74 and the conductor 62 are joined to the solenoid or coil 56.

In accordance with the method of this invention, the capacitor 68 is charged form the power source 60 as the switch 66 is closed. Then the switch 66 is opened, and the switch 72 is closed so that a large magnitude of current flows form the capacitor 68 through the coil or solenoid 56, as illustrated by arrows 76. The flow of current through the coil 56 may be in the order of several thousand amperes. Then this flow of current through the solenoid or coil 56 occurs a high magnitude of magnetic pressure is applied to the tubular member 50a. The pressure upon the tubular member 50a causes reduction of the transverse dimension of the tubular member 50a. Thus, the powder material 54 within the tubular member 50a becomes very firmly compacted. Due to the fact that the coil 56 tends to expand during current flow therethrough, a wall 80 closely encompasses the coil 56 and restrains the coil 56 against radial and axial expansion.

If desired, after the tubular member 50a passes through the electrical coil 56, the tubular member 50a, with the powderous material 54 compacted therewithin, may pass through a sintering operation 84. The sintering operation 84 improves the properties of the compacted powder-like material 54. Power driven roller means 85 are shown for moving the tubular member 50a.

By this means and method, a desired elongate body can be produced. By this means and method superconducting wire or tape or the like can be produced. As illustrated, the process can be a continuous process. By continuously moving the tubular member 50a through the solenoid 56 while current flows through the solenoid 56, continuous lengths of tubes are compacted, and a continuous length of electrical conductor of superconducting material is produced. Thus, superconductors of any desired shape and size and/or length can be produced in a single operation or in a continuous operation or in plurality of operations. Long lengths of superconducting material can be repeatedly and precisely produced by this non-contact method. After processing, the wire of superconducting material may be wound into a coil 86, as shown in FIG. 2.

The method and structure shown in FIG. 2 have been found to be successful in creating a wire-like conductor of superconducting material. As an example or illustration, a wire of superconducting material was produced in which the strip 50 was approximately one-half inch in width and approximately fifteen thousandths of an inch in thickness. The superconductive powder material 54 employed was Bi(Pb)SrCaCuO. The current flow through the coil 56 was in the order of about one hundred thousand amperes. After travel through the coil 56 the transverse dimension of the tubular member 50a was about one-eighth of an inch.

Referring now to FIGS. 3–7C, another embodiment is shown. It should be appreciated that those parts which operate in the same manner as the parts illustrated in FIGS. 1 and 2 have been identified with the same part number except that a "'" has been added thereto.

As best illustrated in FIG. 3, a direct current power supply 20' is coupled to a pair of electric conductors 22' and 24'. Connected to conductor 22' is a switch 26' which is also connected to a conductor 28'. The conductor 28' and the conductor 24' have joined therebetween a capacitor 30'. The conductor 28' is also connected to a switch 32' which is also connected to a conductor 34'. The conductor 24' and the conductor 34'are connected to a solenoid or coil 36' which encompasses an electrically conductive container 100' as shown as being generally cylindrical in transverse dimensions. However, as mentioned earlier herein, the electrically conductive container 100' may be any suitable or desired shape and size. The electrically conductive container 100' may be of any suitable electrically conductive material such as, for example, of silver or copper material.

Within the electrically conductive container 100' is a quantity of powder 102'. The powder 102' fills the electrically conductive container 100' to a desired fill level until a predetermined fill density is achieved. For example, in the illustration being described the predetermined fill density may be on the order about 3.7 grams per cubic centimeter for a ferrous powder. As best illustrated in FIG. 4, it may also be desired to provide a predetermined stand-off distance 106' between the inside of a wall diameter 108' and powder 102'. It has been found that providing some predetermined stand-off distance facilitates accelerating the wall 108' of container 100' as the wall 108' expands radially (as viewed in FIG. 4) to compress powder 102'.

The process and operation of this embodiment is substantially the same as the embodiment described earlier herein. Namely, the switch 26' is closed, and the capacitor 30' is charged from the power supply 20'. after the capacitor 30' is completely charged, the switch 26' is opened and the switch 32' is closed. When the switch 32' is closed a large quantity of electrical current flows from the capacitor 30' through the solenoid or coil 36'. When electrical current flows through the coil or solenoid 36', magnetic pressure is applied upon the electrically conductive container 100'. This pressure acts similarly upon the electrically conductive container 100', and the transverse dimensions of the electrically conductive container 100' are reduced. Thus, compression occurs within electrically conductive container 100', and the powder-like material 102' within the electrically conductive container 100' is compressed and compacted. Thus, the powderous material 102' within the electrically conductive container 100' becomes a dense body.

As with the embodiment described earlier herein, solenoid or coil 36' tends to expand radially as current flows therethrough. Accordingly, means are employed to restrain the coil 36' against lateral expansion as current flows therethrough. For example, as with the first embodiment, a rigid wall 44' closely encompasses the coil 36' and restrains the coil 36'against expansion as current flows therethrough.

As best illustrated in FIG. 5, a process or method for compacting material 102' in accordance with the second embodiment of this invention will now be described. Initially, the powder material 102' is selected (block 108' in FIG. 5) and a density for container 100' is determined at block 110'. As an illustration, a density associated with container 100' may be about 9,000 Kg/M$^3$.

Once the density and thickness of wall 108' of container 100' is determined, the fill density and a compressibility value for powder 102' is determined at block 112'. In this regard, the fill density corresponds to the density of the material after it is situated in container 100' and before it is compacted in accordance with this invention. The compressibility value for material 102' corresponds to the ease or difficulty with which the material 102' compacts.

At block 114', the stand-off distance corresponding to the distance between an inside surface or diameter 108a' and powder 102' is determined. As mentioned earlier herein, it has been found that providing this stand-off distance 106' can facilitate enabling wall 108' to "over-pressure" 102' and achieving high compaction densities, as described later herein.

For ease of illustration, the method and apparatus will be described with the material 102' being a ferrous powder. The density and thickness of wall 108'were selected to be 8.96 grams/CM$_3$ and about 1.0 millimeter, respectively. The fill density for material 102' was selected to be 3.79 g/CM$^3$ and the stand-off distance 106' (FIG. 4) was selected to be zero.

After container 100' density and thickness are determined and the fill density, compressibility value for material 102', and the stand-off distance 106 for material 102' are determined, the container 100' is filled with the material 102' (block 116').

At block 118', a power supply 20' is set to an appropriate current level, which in the illustration being described may be on the order of about 100,000 amperes at a voltage of about 4,000 volts. It is to be understood, of course, that other magnitudes of current and voltage may be employed as found to be suitable in accordance with the size and physical characteristic of the electrically conductive container 100' and the physical characteristics and volume of the material 102' as with the embodiment described earlier herein.

After the current level is selected, the solenoid 36' is energized to magnetically pressure the electrically conductive container 100' to compact material 102' (block 120' in FIG. 5).

At decision block 122', it is determined if more or repeated compaction of material 102' is desired. If it is, then the method loops back to block 116' as shown, otherwise the routine is complete. If it is not, then the routine proceeds to block 124' where the compacted material 102' may be subject to further processing, such as the sinter operation 84 described relative to the embodiment mentioned above. After processing, the wire of material may be wound into a coil 86 of the type shown in FIG. 2.

Advantageously, this method and system described relative to this embodiment provides means for magnetically compacting a material by overpressuring the material such that it is compacted to comprise a density of at least 90% of the maximum density of powder 102'. Further, by selecting and adjusting the various variables, such as the density and thickness of wall 108'of container 100', fill density and compressibility value for material 102' and stand-off distance 106', the material 102' can be compacted in a manner such that the material 102' receives a pressure which is far in excess of the initial pressure applied by container 100'.

FIGS. 6A–6C illustrate various features achieved by this invention. In this regard, notice FIG. 6A illustrates a correlation between the time container 100' is energized relative to the pressure applied by wall 108' to material 102'. Notice the sharp peak at 110' in FIG. 6A which indicates a maximum applied pressure on material 102' of about 5×10$^8$ Pa.

FIGS. 6B and 6C illustrate the correlation between the displacement of wall 108' during the energization process (FIG. 6B) and the velocity of wall 108' as it expands radially to compress material 102'. Notice in FIG. 6C that as the time approaches approximately 3 by 10$^{-5}$ seconds, a maximum velocity (FIG. 6C) of wall 108' is realized and the material 102' displaces (FIG. 6B) as it is compacted. Correlating this to FIG. 6A, it should be appreciated that the wall 108' achieves a radial velocity of about 200 meters per second in less than about 3×10$^{-5}$ seconds as the applied pressure reaches a maximum 100' (FIG. 6A).

Notice in FIG. 7A a correlation between an applied pressure curve 112' and a material pressure curve 114' representing the pressure experienced by material 102' as it is compacted. As the pressure experienced by material 102' exceeds the maximum applied pressure, indicated by point 110', an "overpressure" pressure (represented by double arrow 118' in FIG. 7A) is realized. Because the overpressure far exceeds the maximum input pressure 110' applied by container 100', the material 102' may be compacted to density levels which exceed the levels normally realized with the associated input pressure.

Thus, it should be appreciated that by adjusting one or more of the variables mentioned earlier herein relative to blocks 108–114 (FIG. 5), the material 102' can be overpressured to achieve pressures far greater than the input pressure applied by wall 108' (FIG. 4) of container 100'. This, in turn, enables the apparatus and method of the present invention to densify material 102 to densities in excess of 90% of the material's maximum density or far in excess of densities achieved in response to the maximum applied pressure 110'.

It has been found that these densities have been achieved by accelerating container 100' and energizing coil or solenoid 36' in less than 500 or even 100 microseconds.

In this regard, notice in FIGS. 7B and 7C that the overpressuring of material 102 in accordance with this method and apparatus enables the material 102' to be densified to in excess of 7500 Kg/M$^2$ with an associated input pressure of only 5×10$^8$ Pa.

FIG. 7C further illustrates a correlation between the pressure applied by container 100' and the density realized by material 102', with the additional density associated with the achieved overpressure being represented by double arrow 120' in FIG. 7C.

Advantageously, this method and system provide dynamic means for accelerating wall 108' of container 100' such that the material 102' experiences a pressure which is significantly higher than the input pressure applied by wall 108'. It has been found empirically that the time at which the overpressure pressure 120' (FIG. 7C) varies directly with either the thickness or the density of wall 108'. For example, as the thickness of wall 108' increases, the overpressure 120' also increases. Likewise, the peak pressure 116' has also been found to increase or decrease when the fill density increases or decreases, respectively.

This system and method also provide means for selectively varying some of the input parameters, such as wall thickness and density, stand-off distance, container mass and the like to achieve densities in excess of 90% of the materials maximum density. For example, by increasing the thickness and mass of wall 108', the corresponding velocity required to achieve a predetermined density is decreased when compared to a container having less thickness or mass.

It is to be understood that the method of this invention can be employed in compacting most types of powder-like or powderous materials, such as ceramic compounds, ceramic and metal composites, metals, metal alloys, and metal compounds.

Although the preferred embodiment of the structure and method for compaction of powder-like materials of this invention has been described, it will be understood that within the purview of this invention various changes may be made in the electrical circuitry and in the current flow therethrough, or in the form, details, proportion and arrangement of parts, the combination thereof, and the method of operation, which generally stated consist in a structure and method within the scope of the appended claims.

The invention having thus been described, the following is claimed:

1. A magnetic compaction system for densifying a material to achieve a predetermined density of at least 90% of its maximum density, comprising:

an electrically-conductive container for receiving said material at a predetermined fill density and a predetermined standoff distance, said container comprising a predetermined mass; and an energizer for creating a magnetic field to energize the container to accelerate at least a portion of said container to a predetermined velocity to impact and densify said material to at least 90% of its maximum density.

2. The magnetic compaction system as recited in claim 1 wherein said predetermined mass is directly proportional to a mass of said powder.

3. The magnetic compaction system as recited in claim 1 wherein said energizer energizes said container such that it is displaced at least 0.001 meters in less than about $4 \times 10^{-5}$ seconds.

4. The magnetic compaction system as recited in claim 1 wherein said container is generally cylindrical in cross-section.

5. The magnetic compaction system as recited in claim 1 wherein said energizer comprises:

means for applying said predetermined current to said container for a pulse duration of less than 40 microseconds to achieve said predetermined velocity.

6. The magnetic compaction system as recited in claim 1 wherein said actuator is generally cylindrical in cross-section and comprises said predetermined mass such that when said energizer energizes said container, said container accelerates to at least 100 meters/second in less than 40 microseconds such that said predetermined density is at least 95% of said maximum density.

7. The magnetic compaction system as recited in claim 1 wherein said energizer comprises:

accelerating means for accelerating said container into said powder to achieve a pressure of at least $2 \times 10^8$ pascals in less than 10 microseconds.

8. The magnetic compaction system as recited in claim 1 wherein said container comprises a container thickness selected in consideration of said material.

9. The magnetic compaction system as recited in claim 1 wherein said energizer comprises a coil for receiving said container and for accelerating at least a portion of said container to about 200 meters/second such that said material may achieve said at least 95% of said maximum density.

10. The magnetic compaction system as recited in claim 1 wherein said container comprises a thickness which is directly proportional to a mass of said powder.

11. The magnetic compaction system as recited in claim 7 wherein said coil energizes said container such that said container is displaced at least 0.001 meters in less than about $4 \times 10^{-5}$ seconds.

12. The magnetic compaction system as recited in claim 1 wherein said predetermined velocity is at least 100 meters/second.

* * * * *